(12) United States Patent
Suzuki (10) Patent No.: US 7,550,813 B2
(45) Date of Patent: Jun. 23, 2009

(54) PHOTOELECTRIC CONVERTING FILM STACK TYPE SOLID-STATE IMAGE PICKUP DEVICE, AND METHOD OF PRODUCING THE SAME

(75) Inventor: Nobuo Suzuki, Miyagi (JP)

(73) Assignee: FujifilmCorporation, Tokyo (JP)

( * ) Notice: Subject to any disclaimer, the term of this patent is extended or adjusted under 35 U.S.C. 154(b) by 382 days.

(21) Appl. No.: 11/133,381

(22) Filed: May 20, 2005

(65) Prior Publication Data
US 2005/0263839 A1 Dec. 1, 2005

(30) Foreign Application Priority Data
May 28, 2004 (JP) ............. P.2004-158831

(51) Int. Cl.
*H01L 31/18* (2006.01)
(52) U.S. Cl. ............. 257/440; 257/414; 257/290; 257/291
(58) Field of Classification Search ............. 257/414, 257/440, 290, 291, E31.078
See application file for complete search history.

(56) References Cited

U.S. PATENT DOCUMENTS 4,820,915 A 4/1989 Hamakawa et al. ............. 257/53

6,930,336 B1 8/2005 Merrill ............. 257/292

FOREIGN PATENT DOCUMENTS

| JP | 58-103165 A | 6/1983 |
|---|---|---|
| JP | 2002-502120 A | 1/2002 |
| JP | 2002-83946 A | 3/2002 |
| JP | 2002-083946 A | 3/2002 |
| JP | 2003-502847 A | 1/2003 |
| JP | 3405099 B2 | 3/2003 |
| JP | 2004-335626 | 11/2004 |

*Primary Examiner*—Eugene Lee
(74) *Attorney, Agent, or Firm*—Birch, Stewart, Kolasch & Birch, LLP (57) ABSTRACT

A solid-state image pickup device comprises: a plurality of photoelectric converting films stacked via an insulating layer, the photoelectric converting films being above a semiconductor substrate in which a signal read circuit is formed, in which each of the photoelectric converting films is sandwiched between a pixel electrode film and an opposing electrode film, wherein the pixel electrode film of an upper one of the photoelectric converting films is connected to the signal read circuit by a longitudinal line passing through a lower one of the photoelectric converting films, and, in the longitudinal line, a passing portion which passes through the lower photoelectric converting film is formed by filling an opening with a conductive material, the opening being formed from a same plane of the pixel electrode film stacked on the lower photoelectric converting film to an upper end face of the insulating layer stacked above the photoelectric converting film.

7 Claims, 11 Drawing Sheets

PHOTOELECTRIC CONVERTING FILM STACK TYPE SOLID-STATE IMAGE PICKUP DEVICE, AND METHOD OF PRODUCING THE SAME

BACKGROUND OF THE INVENTION

1. Field of the Invention

The present invention relates to a photoelectric converting film stack type solid-state image pickup device in which a plurality of photoelectric converting films that generate charges corresponding to the amount of received light are stacked on a semiconductor substrate, and more particularly to a photoelectric converting film stack type solid-state image pickup device in which the number of production steps is decreased, the performance is improved, and the production cost is reduced, and a method of producing such a device.

2. Description of the Related Art

In a CCD solid-state image pickup device or a CMOS solid-state image pickup device which is mounted on a digital camera, a large number of photoelectric converting elements (photodiodes) serving as light receiving portions, and signal read circuits which read out photoelectric conversion signals obtained in the photoelectric converting elements are formed on the surface of a semiconductor substrate. The signal read circuits are configured by, in the case of a CCD device, charge transfer circuits and transfer electrodes, or by, in the case of a CMOS device, MOS transistor circuits and signal lines.

In the related-art solid-state image pickup device, therefore, many light receiving portions and signal read circuits must be formed on the same surface of a semiconductor substrate, thereby producing a problem in that the area for the light receiving portions cannot be increased.

The related-art single-type solid-state image pickup device has a configuration in which one of color filters of, for example, red (R), green (G), and blue (B) is stacked on each of light receiving portions, so that the light receiving portion detects a light signal of the one color. In the position of a light receiving portion which detects light of, for example, red, therefore, blue and green signals are obtained by interpolating detection signals of surrounding light receiving portions which detect blue light and green light, respectively. This causes a false color, and reduces the resolution. Furthermore, blue light and green light incident on a light receiving portion where a red color filter is formed do not contribute to photoelectric conversion, but are absorbed as heat into the color filter, thereby producing another problem in that the light use efficiency is poor and the sensitivity is low.

As described above, the related-art solid-state image pickup device has various problems. On the other hand, in such a device, the number of pixels is advancing. At present, a large number or several millions of pixels or light receiving portions are integrated on one chip of a semiconductor substrate, and the size of an opening of each of the light receiving portions is near the order of the wavelength. Consequently, a CCD device and a CMOS device are hardly expected to configure an image sensor which can solve the above-discussed problems, and which is superior in image quality and sensitivity than the related-art one.

Therefore, attention is again paid to the structure of a solid-state image pickup device which is disclosed in, for example, JP-A-58-103165. The solid-state image pickup device has a structure where a red-detection photosensitive layer, a green-detection photosensitive layer, and a blue-detection photosensitive layer are stacked by a film growth technique on a semiconductor substrate in which signal read circuits are formed on the surface, these photosensitive layers are used as light receiving portions, and photoelectric conversion signals obtained in the photosensitive layers are supplied to the outside by the signal read circuits. Namely, the solid-state image pickup device has a structure of a photoelectric converting film stack type.

In this structure, it is not required to dispose the light receiving portions on the surface of the semiconductor substrate. Therefore, restrictions on the design of the signal read circuits are largely eliminated, and the light use efficiency of incident light is improved, so that the sensitivity is enhanced. Moreover, one pixel can detect light of the three primary colors or red, green, and blue. Therefore, the resolution is improved, and a false color does not occur. As a result, it is possible to solve the above-discussed problems of the related-art CCD or CMOS solid-state image pickup device.

Recently, photoelectric converting film stack type solid-state image pickup devices disclosed in JP-A-2002-83946, JP-T-2002-502120, JP-T-2003-502847 and Japanese Patent No. 3,405,099 have been proposed. An organic semiconductor or nanoparticles are used as the photosensitive layers.

When a photoelectric converting film stack type solid-state image pickup device is produced, production of a signal read circuit on the side of a semiconductor substrate is performed in the same manner as the related-art CCD or CMOS image sensor, and hence the production technique of a semiconductor device is used as it is in the production. Furthermore, also photoelectric converting films stacked on a semiconductor substrate, and electrode films and insulating films sandwiching the photoelectric converting films are easily produced by a film growing method using the printing technique, the spraying method, the vacuum depositing method, the sputtering method, the CVD method, or the like.

In a photoelectric converting film stack type solid-state image pickup device, however, it is necessary to form lines which connect a signal read circuit formed on a surface portion of a semiconductor substrate to electrode films of photoelectric converting films stacked on the circuit. Moreover, the lines must be formed as longitudinal lines which are perpendicular to the planes of the electrode films and the surface of the semiconductor substrate.

The longitudinal lines are produced in the following manner. In the related art disclosed in, for example, JP-A-2002-83946, when a photoelectric converting film is grown, longitudinal line forming portions passing through the photoelectric converting film are etched away, and conductors are buried, and, when an electrode film is formed on the photoelectric converting film, longitudinal line forming portions of the electrode film are etched away, and conductors are buried. The work is repeated several times, or at each time when a film is grown. Consequently, there arises a problem in that the number of steps of producing longitudinal lines is increased and the production cost is high.

The longitudinal lines are produced while stacking the photoelectric converting films on the semiconductor substrate. When the number of steps of producing the longitudinal lines is large, the photoelectric converting films are exposed to a high temperature during a process of producing the longitudinal lines, and therefore there is a possibility that the materials of the photoelectric converting film are deteriorated and the performance of photoelectric conversion is adversely affected. Consequently, there is also a request for reducing the number of steps of producing longitudinal lines as far as possible.

The process of producing longitudinal lines consists of repetition of, for example, application of a resist film, exposure, opening of longitudinal line portions by etching, burying of longitudinal line conductors, removal of the resist films, and polishing of the surface. When the process of producing longitudinal lines is interposed between formation of a photoelectric converting film and that of an electrode film on the photoelectric converting film, the interface between the photoelectric converting film and the electrode film is damaged by application and removal of a resist film, and polishing, and there is a possibility that the performance of photoelectric conversion is deteriorated. Because of this reason also, the number of steps of producing longitudinal lines must be reduced.

SUMMARY OF THE INVENTION

It is an object of the invention to provide a photoelectric converting film stack type solid-state image pickup device in which the number of steps of producing longitudinal lines is reduced so as to lower the production cost and the performance of photoelectric conversion is improved, and a method of producing the device.

According to the invention, there is provided a method of producing a photoelectric converting film stack type solid-state image pickup device, in which the photoelectric converting film stack type solid-state image pickup device comprises a plurality of photoelectric converting films stacked via an insulating layer, the photoelectric converting films being above a semiconductor substrate in which a signal read circuit is formed, and in which each of the photoelectric converting films is sandwiched between a pixel electrode film patterned for each pixel and an opposing electrode film opposed to the pixel electrode film, the method comprising connecting the pixel electrode film for an upper one of the photoelectric converting films to the signal read circuit by a longitudinal line passing through a lower one of the photoelectric converting films, wherein the method comprises: stacking a first opposing electrode film on the lower photoelectric converting film, in succession to stacking the lower photoelectric converting film; forming a first opening at a predetermined place of the first opposing electrode film and the lower photoelectric converting film after stacking of the first opposing electrode film and in the same step; filling the first opening with the insulating layer; forming a second opening which is smaller in diameter than said first opening; and filling the second opening with a conductive material, so as to form a portion which passes through the lower photoelectric converting film in the longitudinal line.

According to the configuration, the number of production steps is reduced, and the interface between a photoelectric converting film and an opposing electrode film can be prevented from being damaged. Therefore, the production cost can be lowered, and the performance of photoelectric conversion can be improved.

According to the invention, there is provided a photoelectric converting film stack type solid-state image pickup device comprising: a semiconductor substrate in which a signal read circuit is formed; a plurality of photoelectric converting films stacked via an insulating layer, the photoelectric converting films being above the semiconductor substrate, in which each of the photoelectric converting films is sandwiched between a pixel electrode film patterned for each pixel and an opposing electrode film opposed to the pixel electrode film, wherein the pixel electrode film of an upper one of the photoelectric converting films is connected to the signal read circuit by a longitudinal line passing through a lower one of the photoelectric converting films, and wherein, in the longitudinal line, a passing portion which passes through the lower photoelectric converting film is formed by filling an opening with a conductive material, the opening being formed from a same plane of the pixel electrode film stacked on the lower photoelectric converting film to an upper end face of the insulating layer stacked above the photoelectric converting film.

According to the configuration, the number of production steps is reduced, and the interface between a photoelectric converting film and an opposing electrode film can be prevented from being damaged. Therefore, the production cost can be lowered, and the performance of photoelectric conversion can be improved.

According to the invention, there is provided the photoelectric converting film stack type solid-state image pickup device, further comprising: a first conductive film which is patterned simultaneously with patterning of the lower pixel electrode film, the first conductive film being at a portion of the same plane with which the passing portion is in contact; and a second conductive film which is patterned simultaneously with patterning of the upper pixel electrode film, the second conductive film being on the upper end face of the insulating layer with which the passing portion is in contact.

According to the configuration, the production accuracy of the passing portion of the longitudinal line is improved.

According to the invention, there is provided the photoelectric converting film stack type solid-state image pickup device, further comprising a smoothing transparent insulating film on a portion where a conductive film is removed away by patterning the pixel electrode film.

According to the configuration, the smoothness of the photoelectric converting film is enhanced, and the performance of photoelectric conversion can be further improved.

According to the invention, there is provided the photoelectric converting film stack type solid-state image pickup device, wherein a plurality of photoelectric converting films comprises: a red-detection photoelectric converting film having a peak in a red spectral sensitivity characteristic; a green-detection photoelectric converting film having a peak in a green spectral sensitivity characteristic; and a blue-detection photoelectric converting film having a peak in a blue spectral sensitivity characteristic.

According to the configuration, image signals of the three primary colors can be obtained, and hence a color image can be taken.

According to the invention, there is provided the photoelectric converting film stack type solid-state image pickup device, further comprising: a first longitudinal line for the opposing electrode film, the first longitudinal line upstanding at a place which is an end portion of said photoelectric converting film, and at a place which is separate from the photoelectric converting film; a second longitudinal line for the opposing electrode film, the second longitudinal line being disposed for each of the opposing electrode films, and extending from an upper end face of the insulating layer stacked on the opposing electrode film of each of the photoelectric converting films, to the opposing electrode film; and a connecting conductive film which electrically connects, on upper end faces of the insulating layer, the second longitudinal line with the first longitudinal line.

According to the configuration, the same bias potential can be applied to the opposing electrode films easily.

According to the invention, there is provided the photoelectric converting film stack type solid-state image pickup device, wherein those other than an uppermost one of the connecting conductive films are formed simultaneously with patterning of a conductive film formed on the upper end face of the insulating layer to form the pixel electrode film.

According to the configuration, a portion for applying a bias potential to the opposing electrode films can be constituted easily.

According to the invention, there is provided the photoelectric converting film stack type solid-state image pickup device, wherein a recess is disposed in the upper end face of the insulating layer between the first longitudinal line and the second longitudinal line, and the recess is filled with a conductive material which is identical with the first longitudinal line and the second longitudinal line, wherein the first longitudinal line and the second longitudinal line are electrically connected to each other.

According to the configuration, connection between the first longitudinal line for the opposing electrode film and the second longitudinal line for the opposing electrode film is facilitated. When this configuration is used together with the above-mentioned conductive films, the connection resistance between them can be lowered.

According to the invention, there is provided the photoelectric converting film stack type solid-state image pickup device, wherein the first longitudinal line for the opposing electrode film and the second longitudinal line for the opposing electrode film are formed in a same production step as a longitudinal line which connects the pixel electrode film to the signal read circuit.

According to the configuration, the production cost of the whole photoelectric converting film stack type solid-state image pickup device can be lowered.

DETAILED DESCRIPTION OF THE INVENTION

Hereinafter, embodiments of the invention will be described with reference to the accompanying drawings.

First Embodiment

Figure 1:
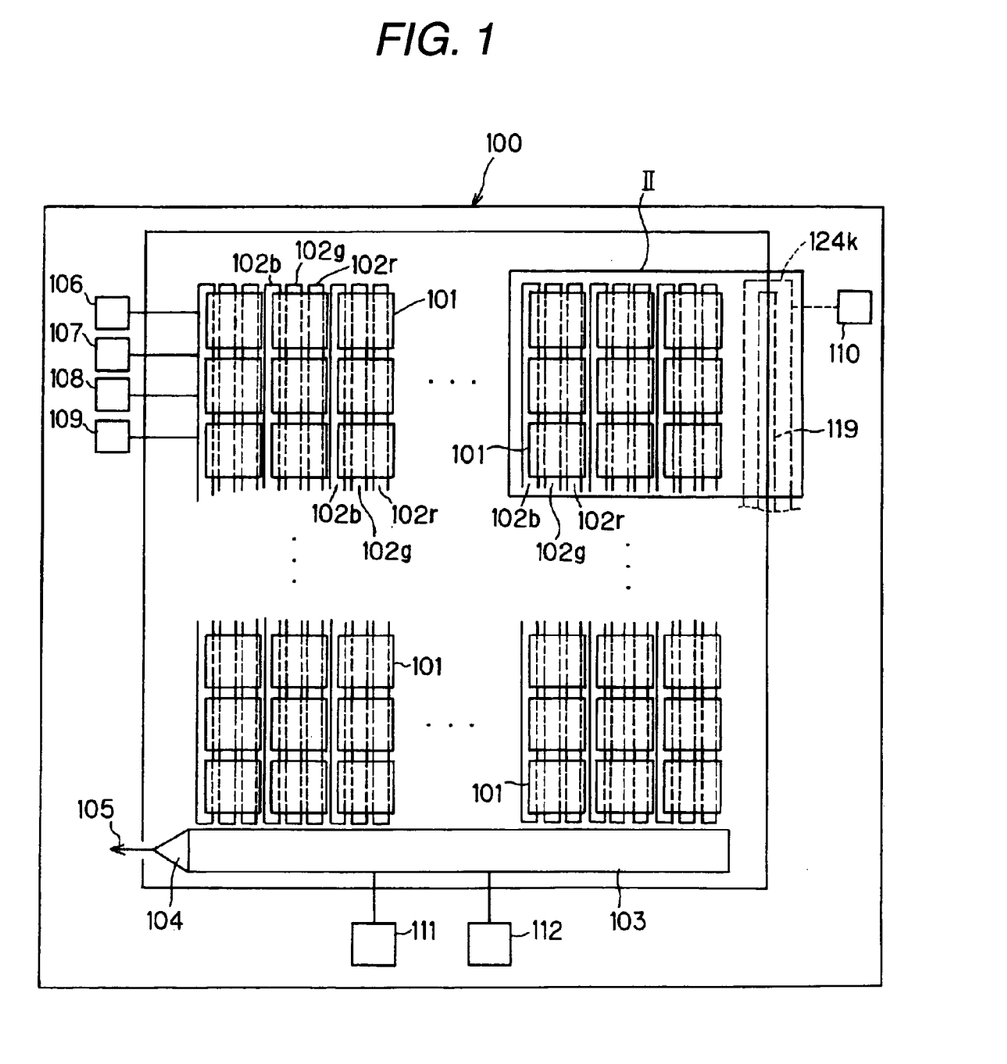
FIG. 1 is a surface diagram of a photoelectric converting film stack type solid-state image pickup device of a first embodiment of the invention.

FIG. 1 is a surface diagram of a photoelectric converting film stack type solid-state image pickup device of a first embodiment of the invention. In the photoelectric converting film stack type solid-state image pickup device 100, many light receiving portions (pixels) 101 are arranged, in this example, vertically and horizontally or in a lattice manner.

On the surface of a semiconductor substrate which is disposed below the light receiving portions 101 of the photoelectric converting film stack type solid-state image pickup device 100, three vertical transfer paths (column CCD registers) 102$b$, 102$g$, 102$r$ (the suffixes b, g, r correspond to blue (B), green (G), and red (R), respectively, and the same shall apply hereinafter) are formed in correspondence with the light receiving portions 101 which are arranged in the column direction, respectively. A horizontal transfer path (row CCD register) 103 is formed in a lower side edge of the semiconductor substrate.

An amplifier 104 is disposed in an exit portion of the horizontal transfer path 103. Signal charges detected in the light receiving portions 101 are first transferred to the horizontal transfer path 103 through the vertical transfer paths 102$b$, 102$g$, 102$r$, and then transferred to the amplifier 104 through the horizontal transfer path 103 to be output as an output signal 105 from the amplifier 104.

On the surface of the semiconductor substrate, electrode terminals 106, 107, 108, 109 connected to four-phase transfer electrodes which are superimposed on the vertical transfer paths 102$b$, 102$g$, 102$r$, and which are not shown are disposed. Four-phase transfer pulses are applied to the electrode terminals. Furthermore, an electrode terminal 110 which is to be connected to a common electrode film that will be described later, and two-phase transfer electrode terminals 111, 112 for the horizontal transfer path 103 are disposed on the surface.

Figure 2A:
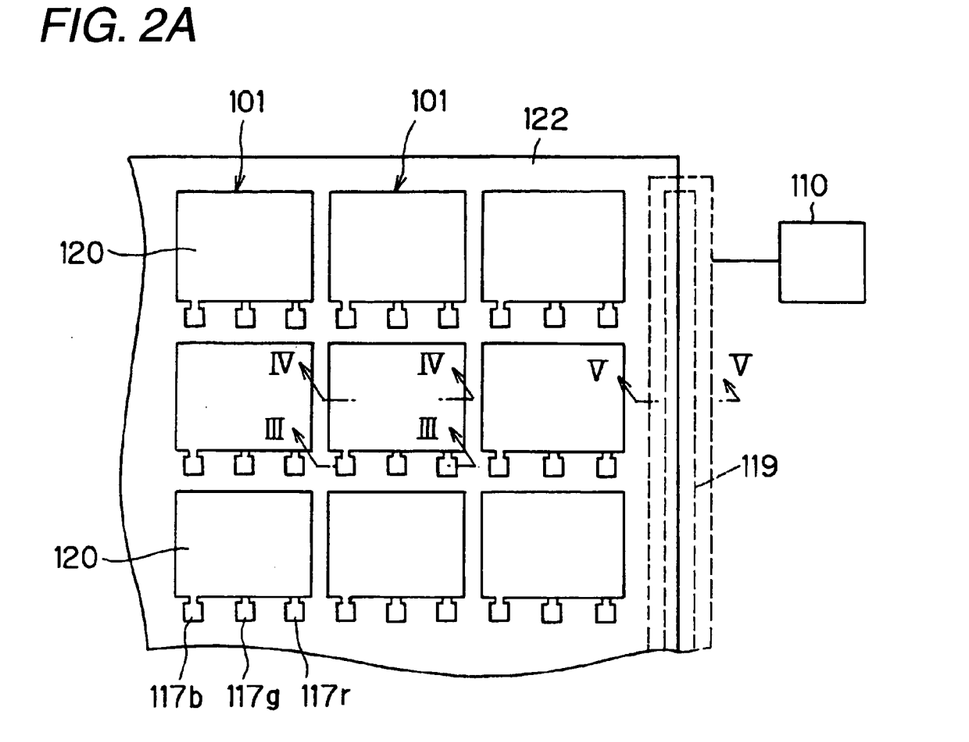
FIG. 2A is an enlarged diagram of the inside of the rectangular frame II in FIG. 1.

FIG. 2A is an enlarged diagram of the inside of the rectangular frame II in FIG. 1, and shows-light receiving portions 101 for nine pixels, and a longitudinal line 119 for the common electrode film to which the electrode terminal 110 is connected. In FIG. 2A, the vertical transfer paths 102r, 102g, 102b shown FIG. 1 are omitted.

Figure 2B:
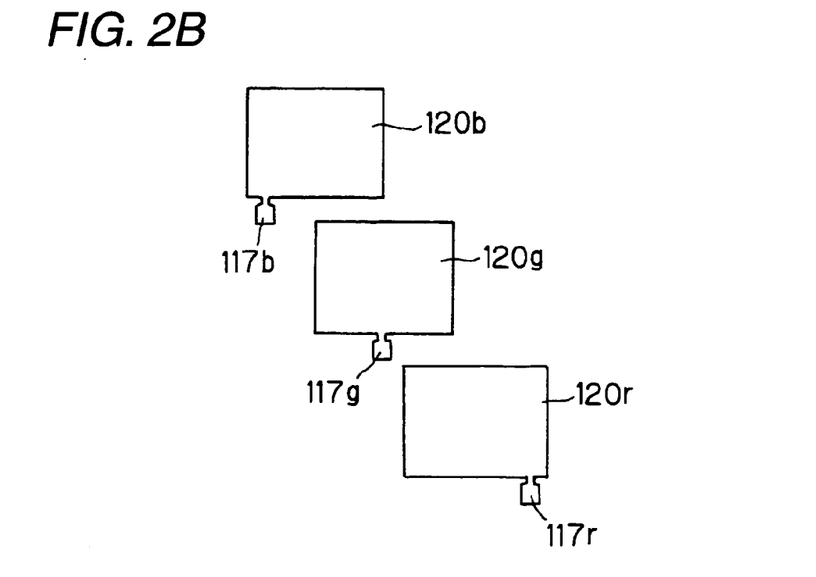
FIG. 2B is an exploded view of a pixel electrode film of a light receiving portion.

Each of the light receiving portions 101 is defined by a rectangular pixel electrode film 120. In the pixel electrode film 120 shown in FIG. 2A, three pixel electrode films 120r, 120g, 120b are aligned in the light incidence direction via photoelectric converting films described later, and the like as shown in FIG. 2B.

In the red pixel electrode film 120r, a longitudinal line connecting pad 117r protrudes in the same plane as the pixel electrode film 120r. Similarly, a longitudinal line connecting pad 117g protrudes from the green pixel electrode film 120g, and a longitudinal line connecting pad 117b from the blue pixel electrode film 120b. As shown in FIG. 2A, the pads 117r, 117g, 117b of the same-pixel (light receiving portion) 101 protrude so as to positionally shift from each other.

The reference numeral 122 shown in FIG. 2A denotes a common electrode film. In the embodiment, also the common electrode film 122 is configured by stacking a red common electrode film 122r, a green common electrode film 122g, and a blue common electrode film 122b via the photoelectric converting films, etc. as described later.

Figure 3:
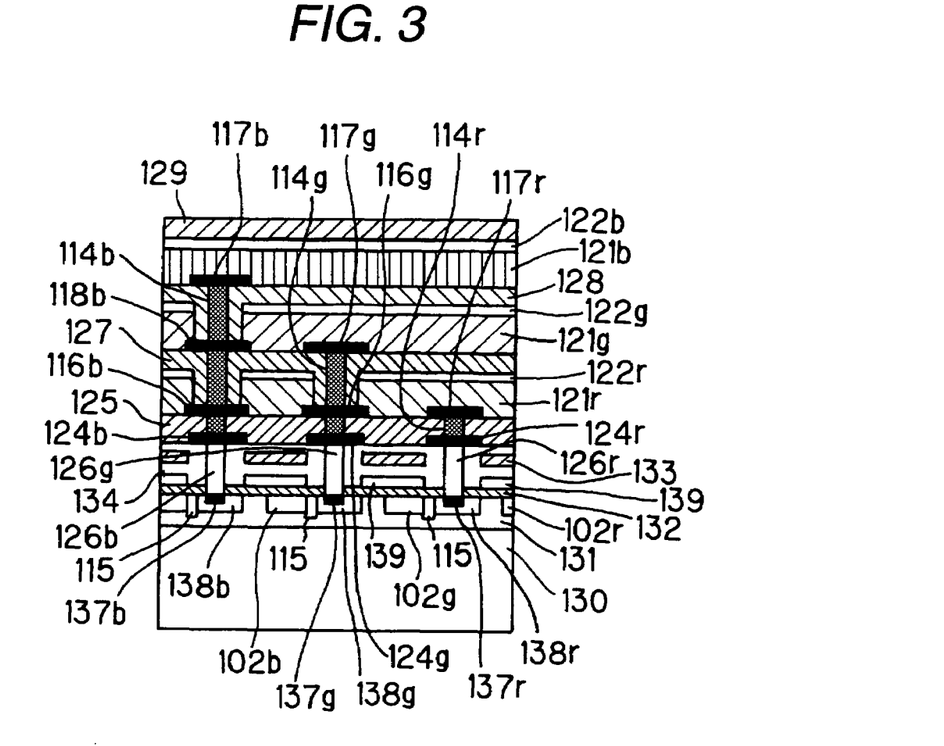
FIG. 3 is a cross-sectional diagram taken along the line III-III in FIG. 2A.
Figure 4:
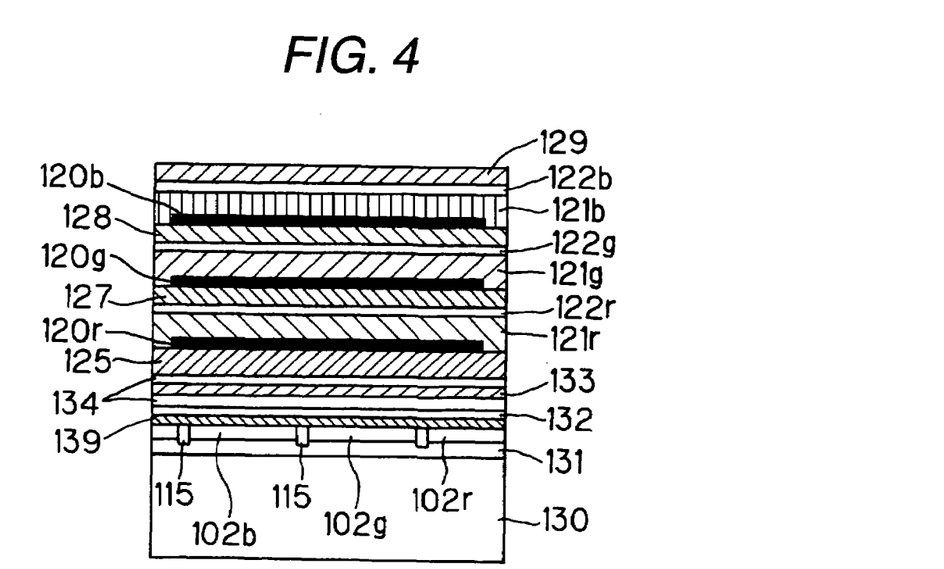
FIG. 4 is a cross-sectional diagram taken along the line IV-IV in FIG. 2A.

FIG. 3 is a cross-sectional diagram taken along the line III-III in FIG. 2A showing a section of the portion of the pads 117r, 117g, 117b, and FIG. 4 is a cross-sectional diagram taken along the line IV-IV in FIG. 2A showing a section of a middle portion of a pixel.

A P-well layer 131 is formed in a surface portion of an n-type semiconductor substrate 130. In a surface portion of the P-well layer 131, charge accumulating portions 138r, 138g, 138b configured by an n-type region, and the vertical transfer paths (n-type semiconductor layers) 102r, 102g, 102b defined by channel stops 115 are formed. Longitudinal line connecting portions 137r, 137g, 137b configured by an n$^+$ region are formed in middle portions of the charge accumulating portions 138r, 138g, 138b.

A gate insulating film 132 is formed on the surface of the semiconductor substrate 130, a transfer electrode 139 made of polysilicon is formed on the film, and an insulating film 134 is formed on the electrode. A light shielding film 133 is formed in the insulating film 134 so that incident light does not enter the vertical transfer paths.

A conductive film is formed on the insulating film 134, and patterned to form lateral lines 124r, 124g, 124b shown in FIG. 3. The longitudinal line connecting portions 137r, 137g, 137b of the charge accumulating portions 138r, 138g, 138b are connected to the lateral lines 124r, 124g, 124b through first longitudinal lines 126r, 126g, 126b, respectively.

An insulating layer 125 is formed on a layer in which the lateral lines 124r, 124g, 124b are disposed, and a transparent conductive film is stacked on the layer. The conductive film is patterned to form the pixel electrode film 120r which is partitioned for each of the light receiving portions 101. As a result of this patterning, the pad 117r shown in FIG. 2B is formed, and conductive films 116b, 116g which are aligned with the pads 117b, 117g in the light incidence direction, and which are separated from other components are left.

A photoelectric converting film 121r for detecting red (R) is stacked on the pixel electrode film 120r, the pad 117r, and the conductive films 116b, 116g. The photoelectric converting film 121r is not required to be partitioned for each of the light receiving portions 101, and is stacked as a single film over the whole light receiving face which is a collection of the light receiving portions 101.

On the photoelectric converting film 121r, a common electrode film (opposed to the pixel electrode film, and hence referred to also as "opposed electrode film") 122r which is common to the light receiving portions 101 for detecting a red signal is stacked similarly as a single film. A transparent insulating film 127 is stacked on the photoelectric converting film.

A transparent conductive film is stacked on the insulating film 127. The conductive film is patterned, and, in the same manner as described above, the pixel electrode film 120g and the pad 117g which are partitioned for each of the light receiving portions 101, and a conductive film 118b which is separated from other components, and which is aligned with the pad 117b shown in FIG. 2B are formed. On the pixel electrode film 120g, and the like, a photoelectric converting film 121g for detecting green (G) is stacked as a single film in the same manner as described above. A common electrode film 122g is stacked on the photoelectric converting film, and a transparent insulating film 128 is stacked on the common electrode film.

A transparent conductive film is stacked on the insulating film 128, and patterned to form a pixel electrode film 120b and the pad 117b which are partitioned for each of the light receiving portions 101. On the above, a photoelectric converting film 121b for detecting blue (B) is stacked as a single film in the same manner as described above. A common electrode film 122b is stacked on the photoelectric converting film, and a transparent protective film 129 is stacked as an uppermost layer.

The lateral line 124b is connected to the pad 117b of the blue pixel electrode film 120b through a second longitudinal line 114b, the lateral line 124g is connected to the pad 117g of the green pixel electrode film 120g through a second longitudinal line 114g, and the lateral line 124r is connected to the pad 117r of the red pixel electrode film 120r through a second longitudinal line 114r. The longitudinal lines 114r, 114g, 114b, 126r, 126g, 126b are produced so as to be electrically insulted from the other components except the pads of the corresponding pixel electrode films, the conductive films 116g, 116b, 118b, and the lateral lines, as described in detail later.

Figure 5:
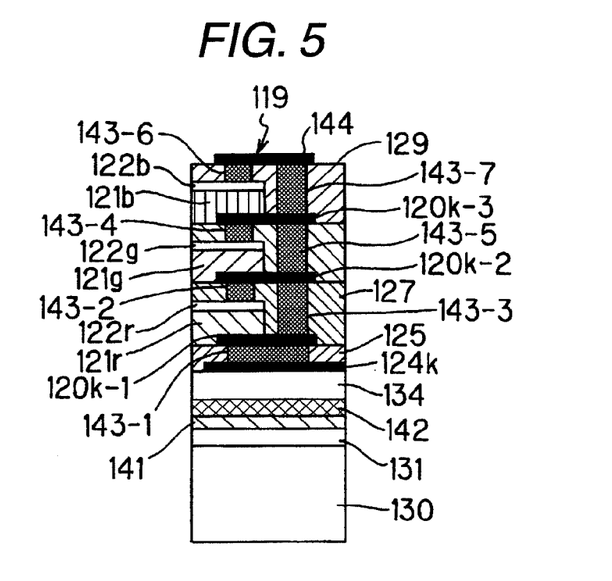
FIG. 5 is a cross-sectional diagram taken along the line V-V in FIG. 2A.

FIG. 5 is a cross-sectional diagram taken along the line V-V in FIG. 2A showing the connection configuration of the electrode terminal 110 which is shown in FIG. 1, and the common electrode films 122b, 122g, 122r. A heavily doped P layer 141 is formed in the P-well layer 131 formed in the surface portion of the n-type semiconductor substrate 130, and a field region (insulating film) 142 is formed on the P layer.

The heavily doped P layer 141 may be formed in the same step as the channel stops 115 shown in FIGS. 3 and 4, or in another step. The insulating film 142 is formed simultaneously with the formation of the gate insulating film 132 shown in FIGS. 3 and 4, and the insulating film forming step is continued even after the formation of the gate insulating film 132 to make the film thickness thicker than the gate insulating film 132.

The insulating film 134 which is identical with that shown in FIGS. 3 and 4 is formed on the insulating film 142, and a conductive film 124k is stacked on the insulating film. The conductive film 124k is formed by patterning the conductive film for forming the lateral lines 124r, 124g, 124b shown in FIGS. 3 and 4. The electrode terminal 110 shown in FIG. 1 is connected to the conductive film 124k.

By patterning the conductive film forming the pixel electrode film 120*r*, a conductive film 120*k*-1 is formed, and a longitudinal line 143-1 is formed between the conductive film 124*k* and the conductive film 120*k*-1.

Similarly, by patterning the conductive film forming the pixel electrode film 120*g*, a conductive film 120*k*-2 is formed, a longitudinal line 143-2 is formed between the common electrode film 122*r* and the conductive film 120*k*-2, and a longitudinal line 143-3 is formed between the conductive film 120*k*-2 and the conductive film 120*k*-1. Therefore, the common electrode film 122*r* and the conductive film 124*k* are electrically connected to each other, and the common electrode film 122*r* is connected to the electrode terminal 110.

Similarly, by patterning the conductive film forming the pixel electrode film 120*b*, a conductive film 120*k*-3 is formed, a longitudinal line 143-4 is formed between the common electrode film 122*g* and the conductive film 120*k*-3, and a longitudinal line 143-5 is formed between the conductive film 120*k*-3 and the conductive film 120*k*-2. Therefore, the common electrode film 122*g* and the conductive film 124*k* are electrically connected to each other, and the common electrode film 122*g* is connected to the electrode terminal 110.

A transparent conductive film 144 is stacked on a corner of the upper face of the protective film 129, a longitudinal line 143-6 is formed between the common electrode film 122*b* and the conductive film 144, and a longitudinal line 143-7 is formed between the conductive film 144 and the conductive film 120*k*-3. Therefore, the common electrode film 122*b* and the conductive film 124*k* are electrically connected to each other, and the common electrode film 122*b* is connected to the electrode terminal 110.

As the homogeneous and transparent electrode films 122*r*, 122*g*, 122*b*, 120*r*, 120*g*, 120*b*, thin films of tin oxide ($SnO_2$), titanium oxide ($TiO_2$), indium oxide ($InO_2$), or indium tin oxide (ITO) are used. However, the materials of the films are not restricted to these oxides.

The photoelectric converting films 121*r*, 121*g*, 121*b* may be formed by a single-layer film or a multilayer film. As the materials of the films, useful are various materials such as: silicon, a compound semiconductor, and a like inorganic material; an organic material including an organic semiconductor and organic pigment; and a quantum dot deposition film configured by nanoparticles.

When light from an object is incident on the thus configured photoelectric converting film stack type solid-state image pickup device 100, photo-charges corresponding to the amount of blue light of the incident light are generated in the blue photoelectric converting film 121*b*, and the photo-charges are accumulated in the charge accumulating portion 138*b* through the longitudinal line 114*b*, the lateral line 124*b*, and the longitudinal line 126*b*. Similarly, photo-charges corresponding to the amount of green incident light are accumulated in the charge accumulating portion 138*g*, and photo-charges corresponding to the amount of red incident light are accumulated in the charge accumulating portion 138*r*. The charges (signal charges) accumulated in the charge accumulating portions 138*r*, 138*g*, 138*b* are read out to the vertical transfer paths 102*r*, 102*g*, 102*b* and transferred to the horizontal transfer path 103. Then, the charges are transferred through the horizontal transfer path 103 to be output from the photoelectric converting film stack type solid-state image pickup device 100.

FIGS. 6A and 6B to 20A and 20B show the production procedure of the photoelectric converting film stack type solid-state image pickup device of the first embodiment of the invention shown in FIGS. 3 to 5. In the figures, "A" is a cross-sectional diagram taken at the same position as FIG. 3, and "B" is a cross-sectional diagram taken at the same position as FIG. 5. FIG. 20A showing the completion of production is identical with FIG. 3, and FIG. 20B is identical with FIG. 5.

Figure 6A:
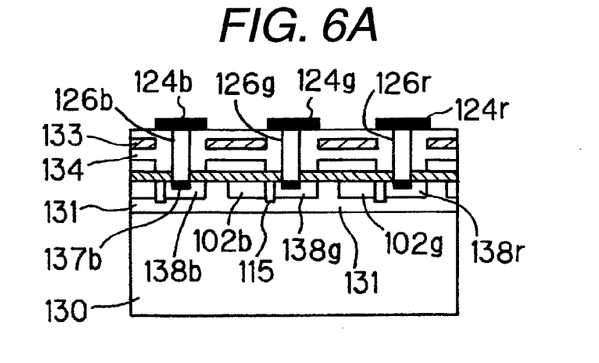
FIGS. 6A and 6B are diagrams showing the production procedure of the photoelectric converting film stack type solid-state image pickup device of the first embodiment.
Figure 6B:
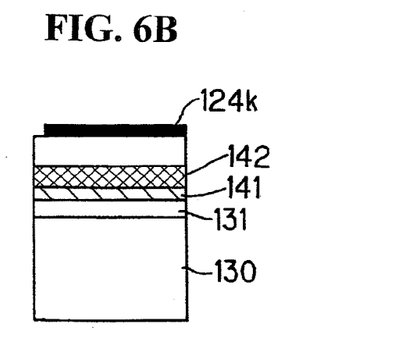

The state of FIGS. 6A and 6B is produced by the same semiconductor production procedure as the related-art CCD type or CMOS type solid-state image pickup device. Namely, the charge accumulating portions 138*r*, 138*g*, 138*b*, and the vertical transfer paths 102*r*, 102*g*, 102*b* are formed in the P-well layer 131 of the semiconductor substrate 130, and the insulating film 134 is formed in the surface portion. Openings for the first longitudinal lines 126*r*, 126*g*, 126*b* are formed in the insulating film 134 by etching. Thereafter, the openings are filled with a metal such as tungsten or copper, or conductive polysilicon to form the first longitudinal lines 126*r*, 126*g*, 126*b*. A transparent conductive film is formed on the surface portion, and then patterned, whereby the lateral lines 124*r*, 124*g*, 124*b* and the conductive film 124*k* are formed. For example, the patterning process is performed in the sequence of application of resist, exposure, developing, and etching.

Figure 7A:
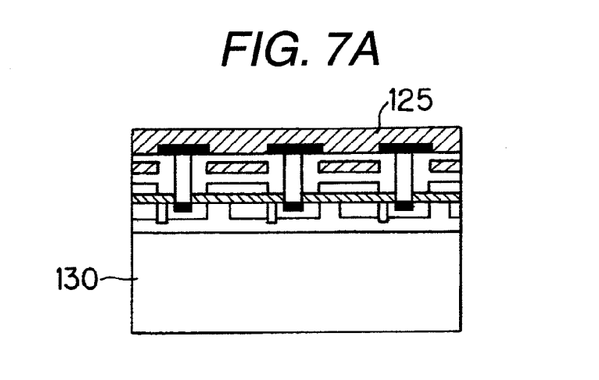
FIGS. 7A and 7B are diagrams showing the production procedure subsequent to FIGS. 6A and 6B.
Figure 7B:
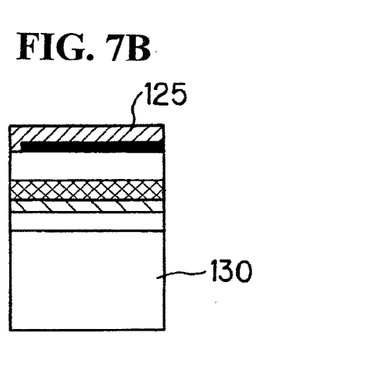
Figure 8A:
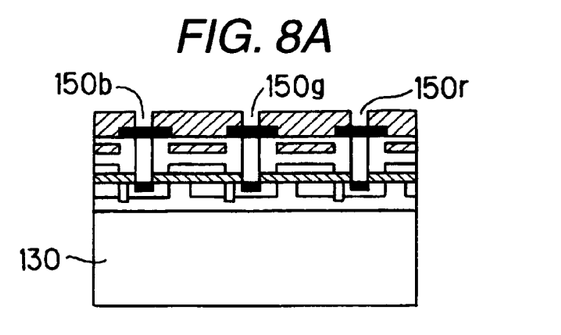
FIGS. 8A and 8B are diagrams showing the production procedure subsequent to FIGS. 7A and 7B.
Figure 8B:
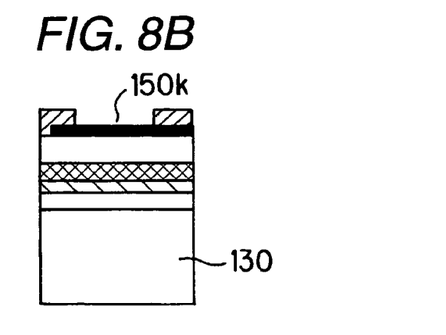
Figure 9A:
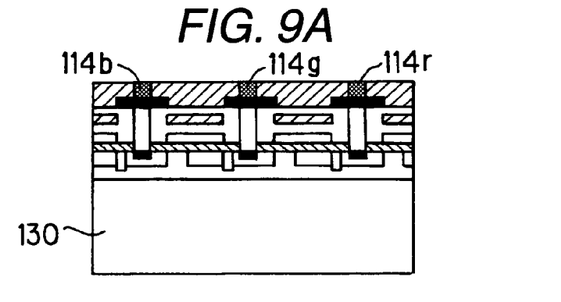
FIGS. 9A and 9B are diagrams showing the production procedure subsequent to FIGS. 8A and 8B.
Figure 9B:
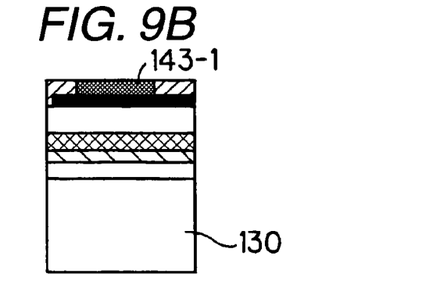
Figure 10A:
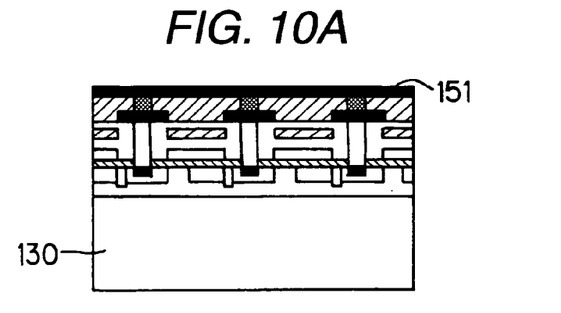
FIGS. 10A and 10B are diagrams showing the production procedure subsequent to FIGS. 9A and 9B.
Figure 10B:
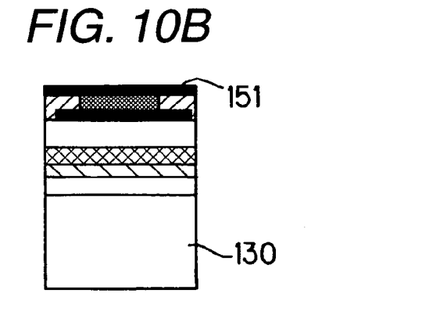

Next, as shown in FIGS. 7A and 7B, the insulating film 125 is stacked on the surface portion, and, as shown in FIGS. 8A and 8B, openings 150*r*, 150*g*, 150*b*, 150*k* which reach the lateral lines 124*r*, 124*g*, 124*b* and the conductive film 124*k*, respectively are formed by etching. Then, as shown in FIGS. 9A and 9B, the openings 150*r*, 150*g*, 150*b*, 150*k* are filled with a transparent conductive material to form parts of the longitudinal lines 114*r*, 114*g*, 114*b*, and the longitudinal line 143-1 described with reference FIGS. 6A and 6B. Furthermore, as shown in FIGS. 10A and 10B, a transparent conductive film 151 is formed on the surface portion.

Figure 11A:
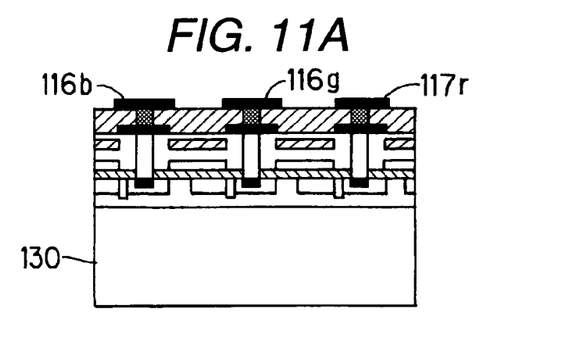
FIGS. 11A and 11B are diagrams showing the production procedure subsequent to FIGS. 10A and 10B.
Figure 11B:
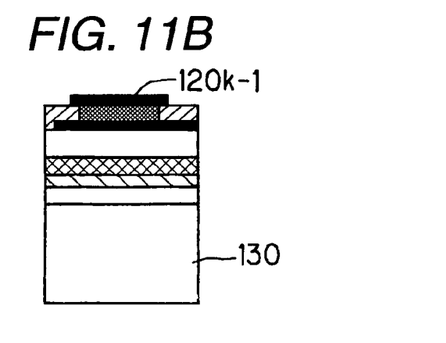
Figure 12A:
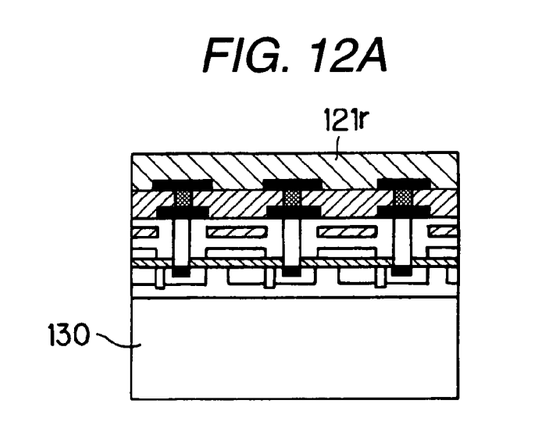
FIGS. 12A and 12B are diagrams showing the production procedure subsequent to FIGS. 11A and 11B.
Figure 12B:
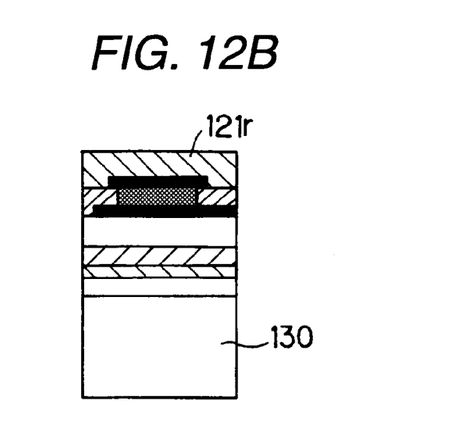
Figure 13A:
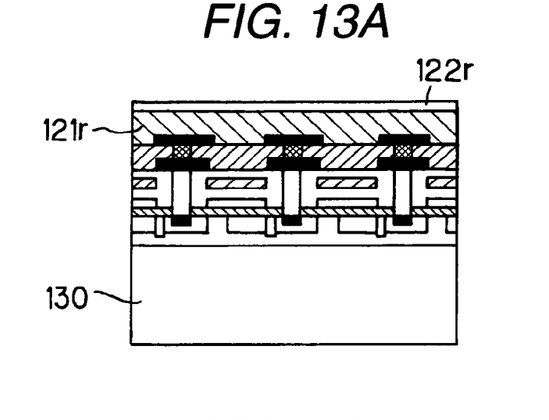
FIGS. 13A and 13B are diagrams showing the production procedure subsequent to FIGS. 12A and 12B.
Figure 13B:
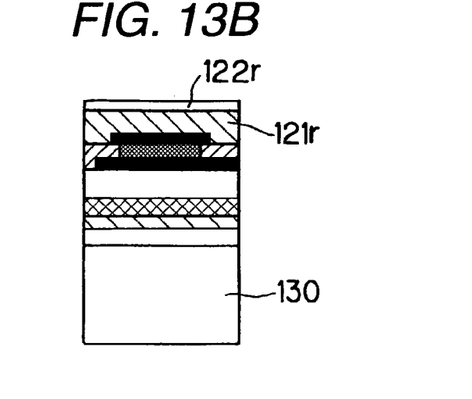

Next, as shown in FIGS. 11A and 11B, the conductive film 151 is patterned, whereby the pixel electrode film 120 is formed, and the pad 117*r*, and the conductive films 116*b*, 116*g*, 120*k*-1 described with reference to FIG. 3 are formed. Thereafter, as shown FIGS. 12A and 12B, the red-detection photoelectric converting film 121*r* is stacked on the surface portion, and, as shown in FIGS. 13A and 13B, the common electrode film 122*r* is stacked on the photoelectric converting film 121*r*.

Figure 14A:
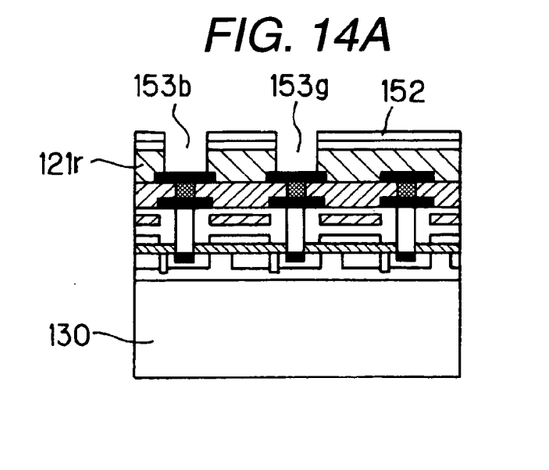
FIGS. 14A and 14B are diagrams showing the production procedure subsequent to FIGS. 13A and 13B.
Figure 14B:
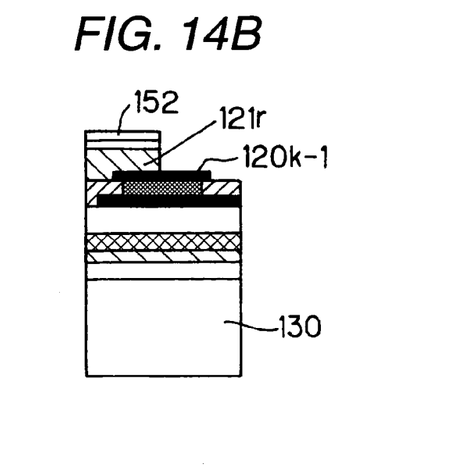

Next, as shown in FIGS. 14A and 14B, a resist film 152 is formed on the surface, and openings 153*b*, 153*g* which are aligned with the positions of the conductive films 116*r*, 116*g* are formed by etching. End portions of the photoelectric converting film 121*r* and the common electrode film 122*r* which are on the conductive film 120*k*-1 are shaved off as shown in FIG. 14B.

As described above, according to the embodiment, in succession to the step of stacking the photoelectric converting film 121*r*, the common electrode film 122*r* is stacked, and the openings 153*b*, 153*g* are formed by etching together with the common electrode film 122*r* and the photoelectric converting film 121*r*. Therefore, the interface between the photoelectric converting film 121*r* and the common electrode film 122*r* is not damaged, and the number of etching steps for the longitudinal line openings can be reduced. When etching is to be performed, the conductive films 116*g*, 116*b* are disposed in the bottoms of the openings. Consequently, etching can be accurately stopped at the positions of the conductive films 116*g*, 116*b*.

Figure 15A:
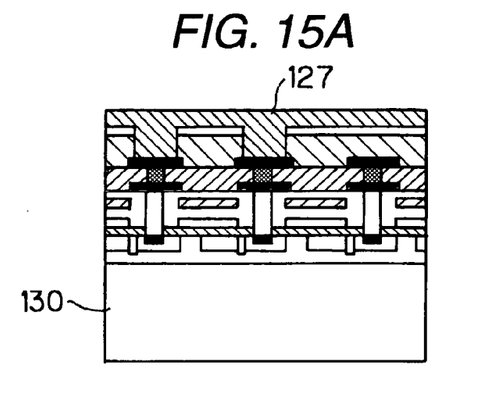
FIGS. 15A and 15B are diagrams showing the production procedure subsequent to FIGS. 14A and 14B.
Figure 15B:
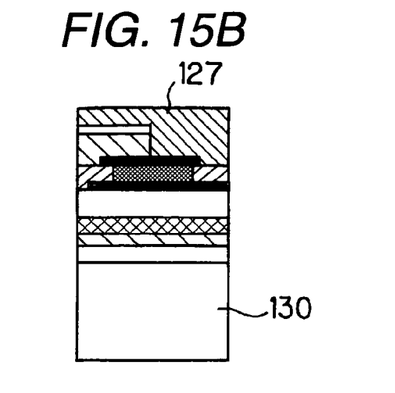
Figure 16A:
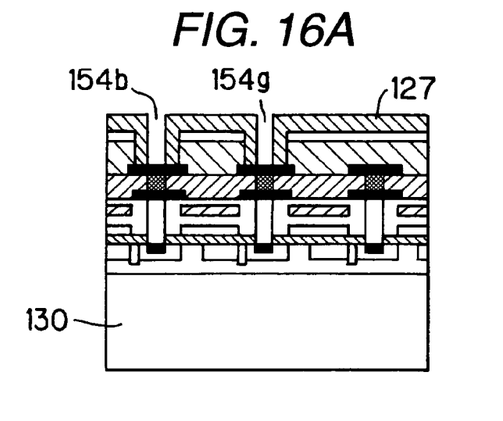
FIGS. 16A and 16B are diagrams showing the production procedure subsequent to FIGS. 15A and 15B.
Figure 16B:
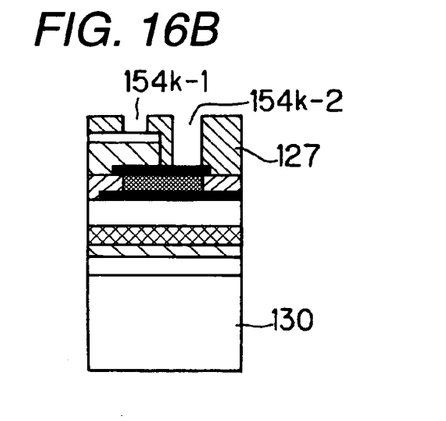

After the openings 153*b*, 153*g* are formed, the insulating film 127 is stacked on the surface portion to fill the openings 153*b*, 153*g* as shown in FIGS. 15A and 15B, and the insulating film 127 is stacked on the shaved portion shown in FIG. 14B. Next, as shown in FIGS. 16A and 16B, openings 154*g*, 154*b* which are smaller in diameter than the openings 153*g*, 153*b* are formed by etching, and an opening 154*k*-*i* which reaches the common electrode film 122r, and an opening 154k-2 which reaches the conductive film 120k-1 are opened in the end portion (FIG. 16B).

Figure 17A:
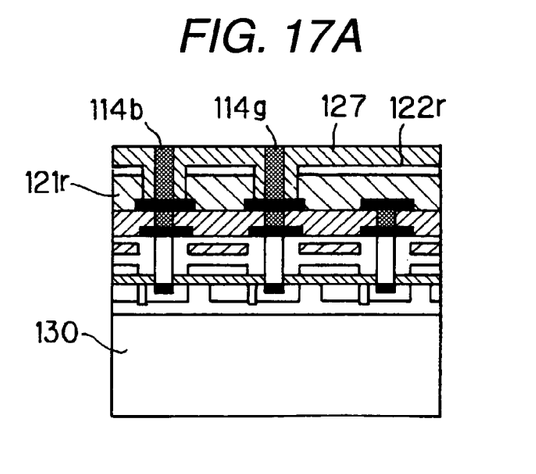
FIGS. 17A and 17B are diagrams showing the production procedure subsequent to FIGS. 16A and 16B.
Figure 17B:
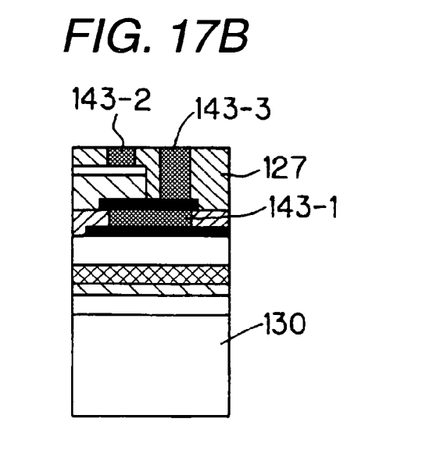

Next, as shown in FIGS. 17A and 17B, the openings 154g, 154b, 154k-1, 154k-2 are filled with a transparent conductive material to form the longitudinal lines 114g, 114b, 143-2, 143-3. After the openings are filled with the transparent conductive material, the surface is subjected to a smoothing process such as CMP (Chemical Mechanical Polishing).

As described above, in the embodiment, the longitudinal lines 114g, 114b which pass through the three layers or the insulating layer 127, the common electrode film 122r, and the photoelectric converting film 121r are produced in the same step. Therefore, the number of steps of producing the longitudinal lines is reduced.

Figure 18A:
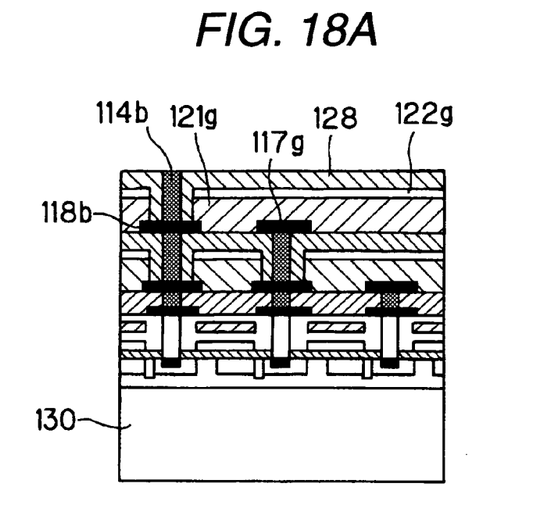
FIGS. 18A and 18B are diagrams showing the production procedure subsequent to FIGS. 17A and 17B.
Figure 18B:
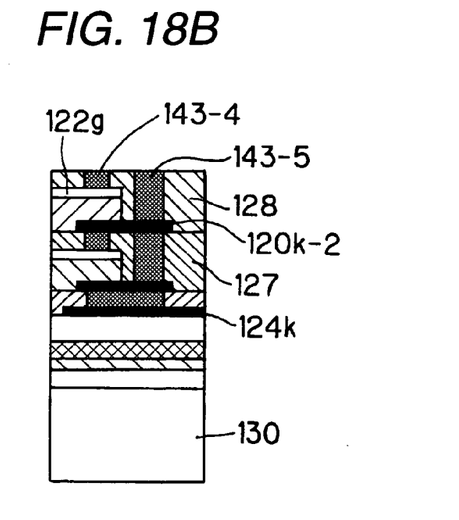

Then, a procedure which is similar to the production procedure of FIGS. 10A and 10B to 17A and 17B is repeated to, as shown in FIGS. 18A and 18B, form the longitudinal line 114b which passes through the green-detection photoelectric converting film 121g and the common electrode film 122g, and form the longitudinal lines 143-4, 143-5 in the end portion.

Figure 19A:
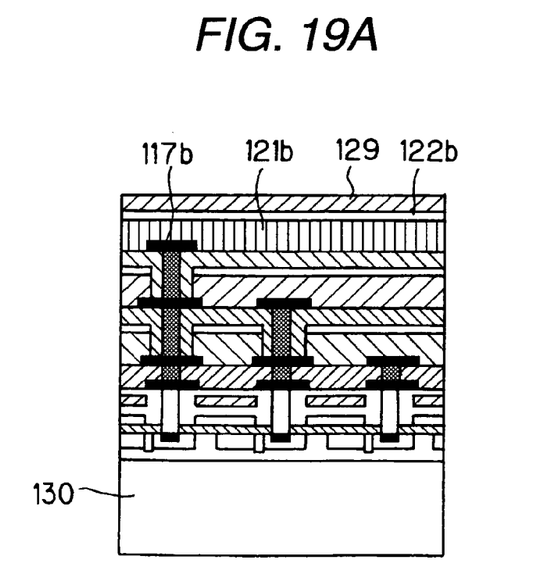
FIGS. 19A and 19B are diagrams showing the production procedure subsequent to FIGS. 18A and 18B.
Figure 19B:
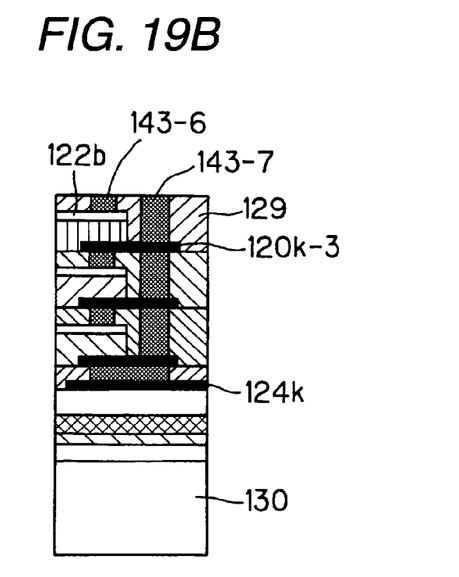
Figure 20A:
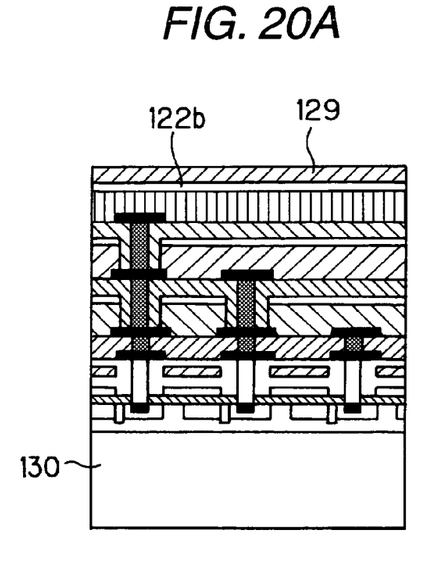
FIGS. 20A and 20B are diagrams showing the production procedure subsequent to FIGS. 19A and 19B.
Figure 20B:
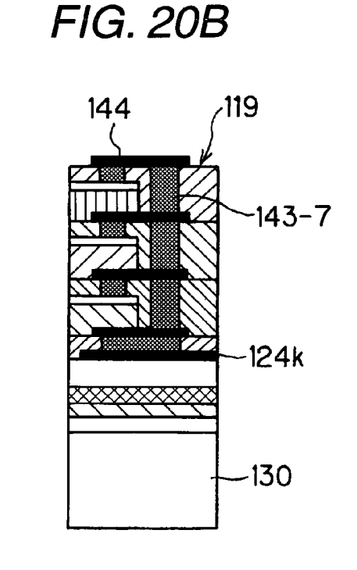

Furthermore, as shown in FIGS. 19A and 19B, the pixel electrode film 120b and the pad 117b are formed, the blue-detection photoelectric converting film 121b, the common electrode film 122b, and the transparent protective film 129 are formed thereon, openings are formed by etching at predetermined places of the transparent protective film 129, and the openings are filled with a conductive material to form the longitudinal lines 143-6, 143-7. Finally, as show in FIGS. 20A and 20B, the conductive film 144 which connects the longitudinal lines 143-6, 143-7 to each other is formed.

As described above, according to the embodiment, in succession to the step of stacking the lower photoelectric converting film, the stacking of the common electrode film is successively conducted, and the common electrode film and the photoelectric converting film are etched together to form openings. Therefore, the interface between the photoelectric converting film and the common electrode film is not damaged, and the number of etching steps for longitudinal line openings can be reduced. As a result, the performance of photoelectric conversion can be improved, and the production cost can be lowered.

Second Embodiment

Figure 21A:
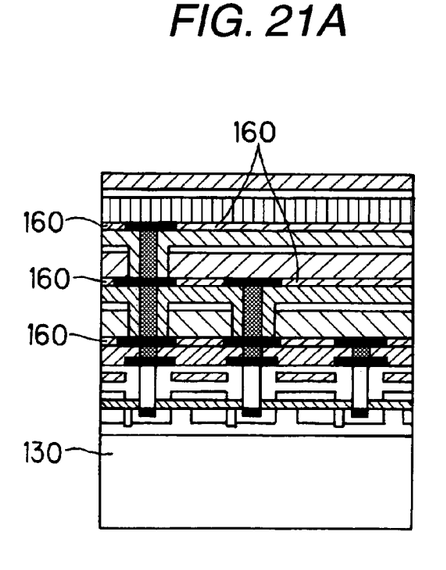
FIGS. 21A and 21B are cross-sectional diagrams of a photoelectric converting film stack type solid-state image pickup device of a second embodiment of the invention.
Figure 21B:
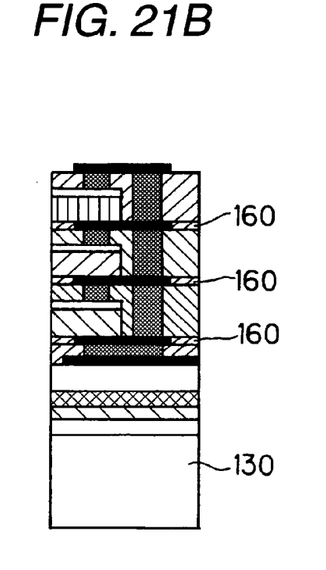
Figure 22A:
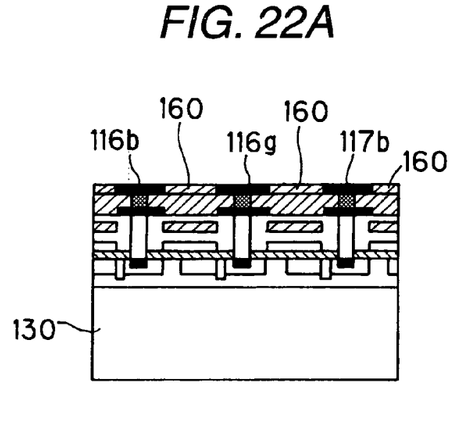
FIGS. 22A and 22B are cross-sectional diagrams showing the middle of the production of the photoelectric converting film stack type solid-state image pickup device shown FIGS. 21A and 21B.
Figure 22B:
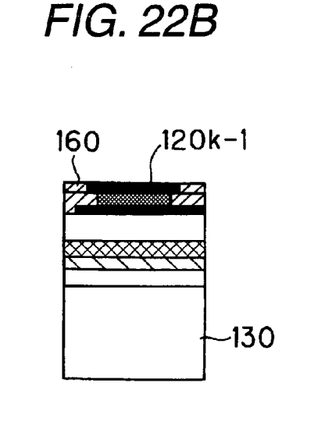

FIGS. 21A and 21B are cross-sectional diagrams of a photoelectric converting film stack type solid-state image pickup device of a second embodiment of the invention, and FIGS. 22A and 22B are cross-sectional diagrams showing the middle of the production of the device. In the figures, "A" is a cross-sectional diagram taken at the same position as FIG. 3, and "B" is a cross-sectional diagram taken at the same position as FIG. 5 in the same manner as FIGS. 6A and 6B to 20A and 20B.

FIGS. 22A and 22B are diagrams showing a production procedure after the production step of FIGS. 11A and 11B in the first embodiment. In the first embodiment, after the step of FIGS. 11A and 11B in which the conductive film 151 is patterned, the photoelectric converting film 121r is stacked as shown in FIGS. 12A and 12B. When the conductive film 151 is patterned to form the conductive films 116g, 116b, the pad 117b and the pixel electrode film 120b, a step difference is formed in an end of each film.

When the conductive film 151 is thin, these step differences produce no problem. When the thickness is not negligible, asperities corresponding to the step differences of the ends of the films 116g, 116b, the pad 117b, and the pixel electrode film 120b are formed on the surface of the photoelectric converting film 121r stacked on the conductive film, thereby producing a possibility that the dark current (leakage current) may be increased, or pixel defects or the like may be caused. From the viewpoint that the sheet resistance is reduced, it is preferable to thicken the pixel electrode film 120b. When the film is excessively thick, however, the step differences are large.

In the embodiment, after the films 116g, 116b, the pad 117b, and the pixel electrode film 120b are patterned, therefore, spaces between the films are filled with a transparent insulating film 160, and the surface is subjected to a smoothing process. This is applied also to the step differences of the electrode films in the upper layers or the green- and blue-detection photoelectric converting films 121g, 121b (see FIGS. 21A and 21B), and spaces are filled with the transparent insulating film 160. As a result, asperities of the photoelectric converting films can be eliminated, and the performance of photoelectric conversion can be further improved.

Third Embodiment

Figure 23A:
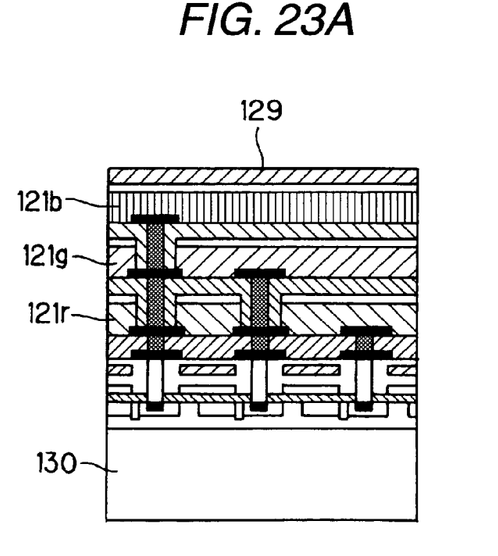
FIGS. 23A and 23B are cross-sectional diagrams of a photoelectric converting film stack type solid-state image pickup device of a third embodiment of the invention.
Figure 23B:
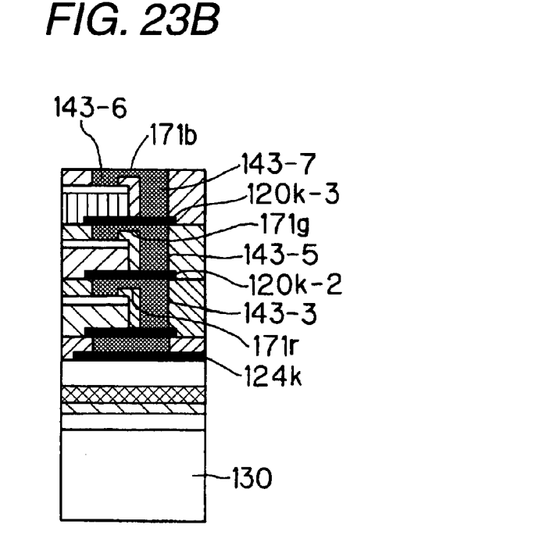

FIGS. 23A and 23B are cross-sectional diagrams of a photoelectric converting film stack type solid-state image pickup device of a third embodiment of the invention, and FIGS. 24A and 24B to 26A and 26B are diagrams showing the middle of the production of the device. In the figures, "A" is a cross-sectional diagram taken at the same position as FIG. 3, and "B" is a cross-sectional diagram taken at the same position as FIG. 5 in the same manner as FIGS. 6A and 6B to 20A and 20B.

In the first and second embodiments, as shown in, for example, FIG. 5, the longitudinal line 143-2 is connected to the longitudinal line 143-3 through the conductive film 120k-2. The conductive film 120k-2 is formed by patterning the conductive film for forming the pixel electrode film 120g. As described in the second embodiment, preferably, the pixel electrode film is thin because asperities of the photoelectric converting film are suppressed. When the pixel electrode film is thin, however, also the conductive film 120k-2 which is formed by the same patterning process is thin, and the connection resistance between the longitudinal lines 143-2 and 143-3 is increased.

Figure 24A:
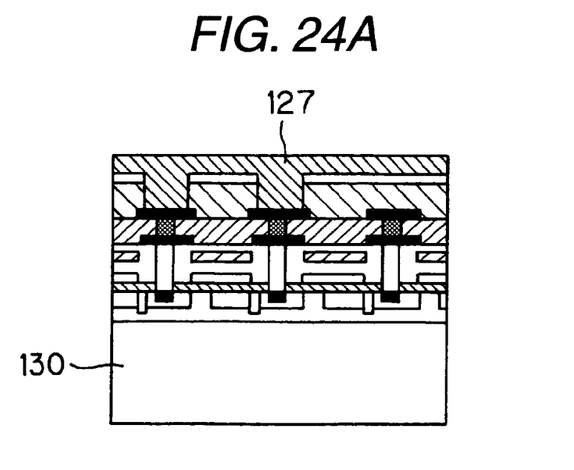
FIGS. 24A and 24B are diagrams showing the middle of the production procedure of the photoelectric converting film stack type solid-state image pickup device of the third embodiment.
Figure 24B:
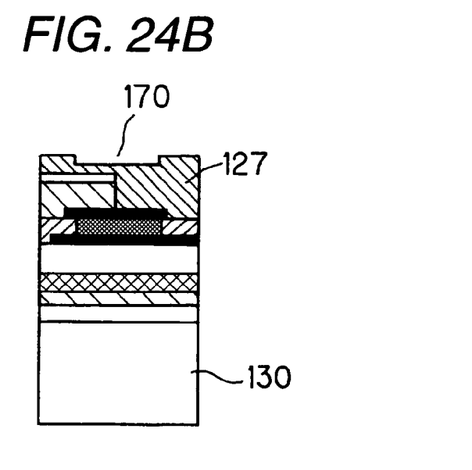
Figure 25A:
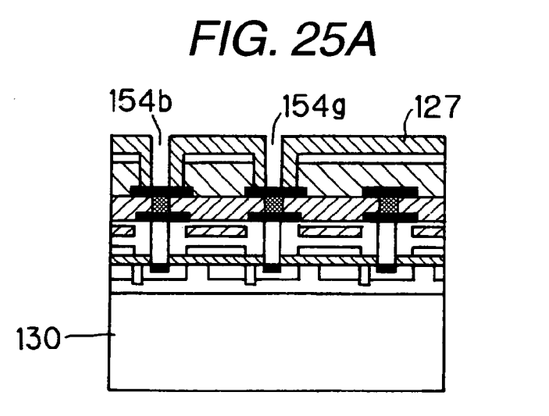
FIGS. 25A and 25B are diagrams showing the production procedure subsequent to FIGS. 24A and 24B.
Figure 25B:
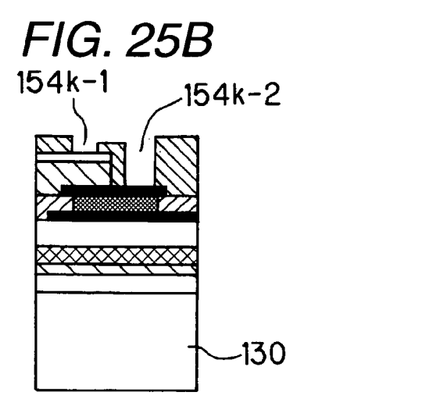
Figure 26A:
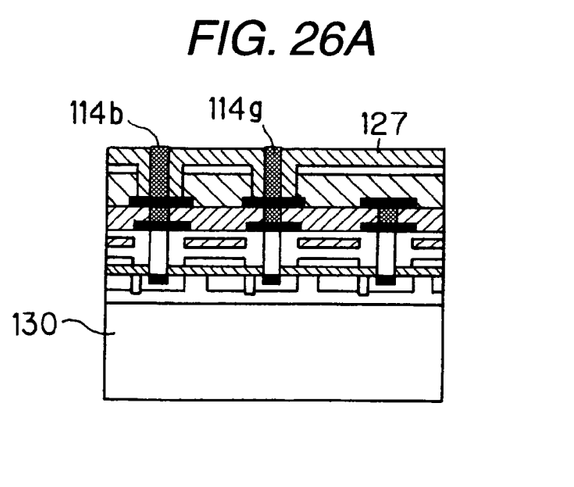
FIGS. 26A and 26B are diagrams showing the production procedure subsequent to FIGS. 25A and 25B.
Figure 26B:
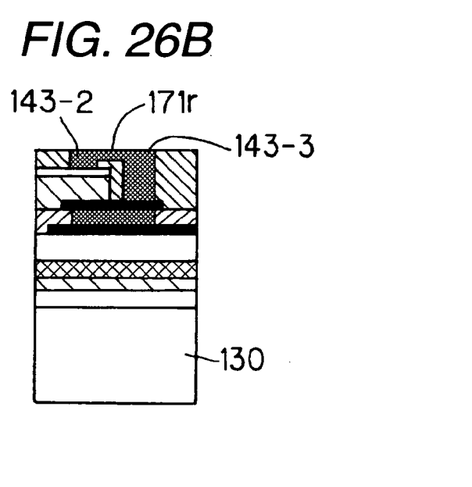

In the embodiment, after the insulating film 127 shown FIGS. 15A and 15B is stacked, a recess 170 is shaved off at a place aligned with the conductive film 120k-2 (see FIGS. 18A and 18B) which is stacked above the film, as shown in FIG. 24B. According to the configuration, as shown in FIGS. 25A and 25B, the openings 154b, 154g, 154k-1, 154k-2 are opened in the same manner as FIGS. 16A and 16B, and thereafter the openings 154b, 154b, 154k-1, 154k-2 are filled by stacking a conductive material as shown in FIGS. 26A and 26B. At this time, also the recess 170 is filled with the conductive material, and a bridge portion 171r connecting the longitudinal lines 143-2 and 143-3 to each other is formed. When the conductive film 120k-2 is formed on the bridge portion 171r, therefore, the connection resistance between the longitudinal lines 143-2 and 143-3 is lowered.

As shown in FIGS. 23A and 23B, in the embodiment, the conductive film 144 shown in FIG. 5 is not disposed on the uppermost protective film 129. When the connection resistance of a bridge portion 171b for the uppermost layer is low, it is not required to dispose the conductive film 144, and the uppermost face can be made flat. Alternatively, the conductive film 144 may be disposed. When the resistances of the bridge portions 171r, 171g are low, the conductive films 120k-2, 120k-3 may be omitted.

In the embodiments described above, a CCD type signal read circuit is formed on a semiconductor substrate. The invention can be similarly applied to a photoelectric converting film stack type solid-state image pickup device in which a signal read circuit is configured by a MOS transistor circuit. The embodiments in which the connection pads 117r, 117g, 117b outward protrude from the peripheries of the pixel electrode films 120r, 120g, 120b have been described. Alternatively, the invention can be applied also to a configuration where longitudinal lines are connected to the inner side of the pixel electrode film 120.

In the embodiments, after, for example, an insulating film is formed, a resist film is formed, and openings for longitudinal lines are formed by etching. Alternatively, a transparent resist film may be used as the insulating films 125, 127, 128, etc. This configuration is effective in the case where the etching selectivity of a resist film and an insulating film is not large.

In the embodiments, the solid-state image pickup devices in which three photoelectric converting films for detecting three colors or red, green, and blue are stacked have been described. The invention is applicable to a solid-state image pickup device in which at least two photoelectric converting films are stacked.

According to the invention, the number of steps of producing longitudinal lines for connecting pixel electrode films to a signal read circuit can be reduced, the production cost can be lowered, and the performance of photoelectric conversion can be improved.

The photoelectric converting film stack type solid-state image pickup device of the invention can be used in place of the related-art CCD or CMOS image sensor. When three photoelectric converting films are disposed, signals of three colors or red, green, and blue can be obtained without using color filters. Therefore, the device is useful when it is mounted on a digital camera.

The entire disclosure of each and every foreign patent application from which the benefit of foreign priority has been claimed in the present application is incorporated herein by reference, as if fully set forth.

What is claimed is:

1. A photoelectric converting film stack type solid-state image pickup device comprising:
   a semiconductor substrate in which a signal read circuit is formed;
   a plurality of photoelectric converting films stacked alternately with insulating layers, the photoelectric converting films being above the semiconductor substrate, in which each of the photoelectric converting films is sandwiched between a pixel electrode film patterned for each pixel and an opposing electrode film opposed to the pixel electrode film; and
   a smoothing transparent insulating film on a portion where a conductive film is removed away by patterning the pixel electrode film,
   wherein the pixel electrode film of an upper one of the photoelectric converting films is connected to the signal read circuit by a first longitudinal line passing through a lower one of the photoelectric converting films, and
   wherein, in the first longitudinal line, a passing portion which passes through the lower photoelectric converting film is formed by filling an opening with a conductive material, the opening being from a plane of the pixel electrode film stacked below the lower photoelectric converting film to an upper end face of the insulating layer stacked above the lower photoelectric converting film.

2. The photoelectric converting film stack type solid-state image pickup device according to claim 1, further comprising:
   a first conductive film which is patterned simultaneously with patterning of the lower pixel electrode film, the first conductive film being at a portion of the same plane with which the passing portion is in contact; and
   a second conductive film which is patterned simultaneously with patterning of the upper pixel electrode film, the second conductive film being on the upper end face of the insulating layer with which the passing portion is in contact.

3. The photoelectric converting film stack type solid-state image pickup device according to claim 1, wherein
   the plurality of photoelectric converting films comprises:
   a red-detection photoelectric converting film having a peak in a red spectral sensitivity characteristic;
   a green-detection photoelectric converting film having a peak in a green spectral sensitivity characteristic; and
   a blue-detection photoelectric converting film having a peak in a blue spectral sensitivity characteristic.

4. The photoelectric converting film stack type solid-state image pickup device according to claim 1, further comprising:
   a second longitudinal line for the opposing electrode film, the second longitudinal line upstanding at a place which is an end portion of said photoelectric converting film, and at a place which is separate from the photoelectric converting film;
   a third longitudinal line for the opposing electrode film, the third longitudinal line being disposed for each of the opposing electrode films, and extending from an upper end face of the insulating layer stacked on the opposing electrode film of each of the photoelectric converting films, to the opposing electrode film; and
   a connecting conductive film which electrically connects, on upper end faces of the insulating layer, the second longitudinal line with the third longitudinal line.

5. The photoelectric converting film stack type solid-state image pickup device according to claim 4, wherein those other than an uppermost one of the connecting conductive films are formed simultaneously with patterning of a conductive film formed on the upper end face of the insulating layer to form the pixel electrode film.

6. The photoelectric converting film stack type solid-state image pickup device according to claim 4, wherein a recess is disposed in the upper end face of the insulating layer between the third longitudinal line and the second longitudinal line, and the recess is filled with a conductive material which is identical with the third longitudinal line and the second longitudinal line, wherein the third longitudinal line and the second longitudinal line are electrically connected to each other.

7. The photoelectric converting film stack type solid-state image pickup device according to claim 4, wherein the third longitudinal line for the opposing electrode film and the second longitudinal line for the opposing electrode film are formed in a same production step as the first longitudinal line which connects the pixel electrode film to the signal read circuit.

* * * * *